US012805412B2

(12) United States Patent
Yang et al.

(10) Patent No.: US 12,805,412 B2
(45) Date of Patent: Nov. 17, 2026

(54) INTEGRATED FAN-OUT PACKAGE AND METHOD OF MAKING SAME

(71) Applicant: Taiwan Semiconductor Manufacturing Company, Hsinchu (TW)

(72) Inventors: Tien-Chung Yang, Hsinchu (TW); Li-Hsien Huang, Zhubei (TW); Ting-Ting Kuo, Hsinchu (TW); Yao-Chun Chuang, Hsinchu (TW); Yinlung Lu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 851 days.

(21) Appl. No.: 17/879,249

(22) Filed: Aug. 2, 2022

(65) Prior Publication Data

US 2024/0047321 A1 Feb. 8, 2024

(51) Int. Cl.

| | |
|---|---|
| ***H10W 74/00*** | (2026.01) |
| ***H10W 70/05*** | (2026.01) |
| ***H10W 70/65*** | (2026.01) |
| ***H10W 70/66*** | (2026.01) |

(Continued)

(52) U.S. Cl.

CPC ......... *H10W 90/701* (2026.01); *H10W 70/05* (2026.01); *H10W 70/095* (2026.01); *H10W 70/65* (2026.01); *H10W 70/66* (2026.01); *H10W 70/685* (2026.01); *H10W 90/00* (2026.01); *H10W 90/401* (2026.01); *H10W 74/00* (2026.01); *H10W 90/724* (2026.01)

(58) Field of Classification Search

CPC ............. H01L 21/486; H01L 23/49822; H01L 23/49833; H01L 23/49866; H01L 25/16; H01L 24/16; H01L 2224/16227; H01L 2224/16237; H01L 2924/1436; H01L 2924/15311; H01L 2924/182; H01L 2924/37001; H01L 23/5389; H01L 25/18; H01L 2225/1023; H01L 2225/1035; H01L 2225/1041; H01L 25/105; H01L 2225/1058

See application file for complete search history.

(56) References Cited

U.S. PATENT DOCUMENTS 11,011,501 B2 * 5/2021 Tai .................... H01L 23/49822
2006/0038291 A1 * 2/2006 Chung ................. H05K 3/3436 257/E23.021

(Continued)

*Primary Examiner* — Tucker J Wright
*Assistant Examiner* — Vincent Kipkemoi Rono
(74) *Attorney, Agent, or Firm* — Lippes Mathias LLP

(57) ABSTRACT

In a method of manufacturing an integrated fan-out (InFO) package, access openings are formed passing through a dielectric layer covering an interface redistribution layer (RDL) to expose electrical contacts of the interface RDL, or within which electrical contacts of the interface RDL are formed. Thereafter, an adhesive tape or other second dielectric layer is disposed over both the dielectric layer and the electrical contacts, and aligned openings are formed passing through the second dielectric layer which are aligned with the access openings passing through the dielectric layer. Each aligned opening is smaller than the aligned access opening, Solderable pads are formed on the electrical contacts of the interface RDL.

20 Claims, 14 Drawing Sheets

(51) Int. Cl.
*H10W 70/685* (2026.01)
*H10W 90/00* (2026.01)

(56) References Cited

U.S. PATENT DOCUMENTS

| | | | | |
|---|---|---|---|---|
| 2008/0251917 | A1* | 10/2008 | Chu | H05K 1/113 257/738 |
| 2012/0161331 | A1* | 6/2012 | Gonzalez | H10W 70/614 257/774 |
| 2015/0340332 | A1* | 11/2015 | Rinne | H10W 70/05 257/737 |
| 2020/0098713 | A1* | 3/2020 | Morifuji | H10W 42/121 |
| 2020/0343223 | A1* | 10/2020 | Chen | H10P 72/74 |

* cited by examiner

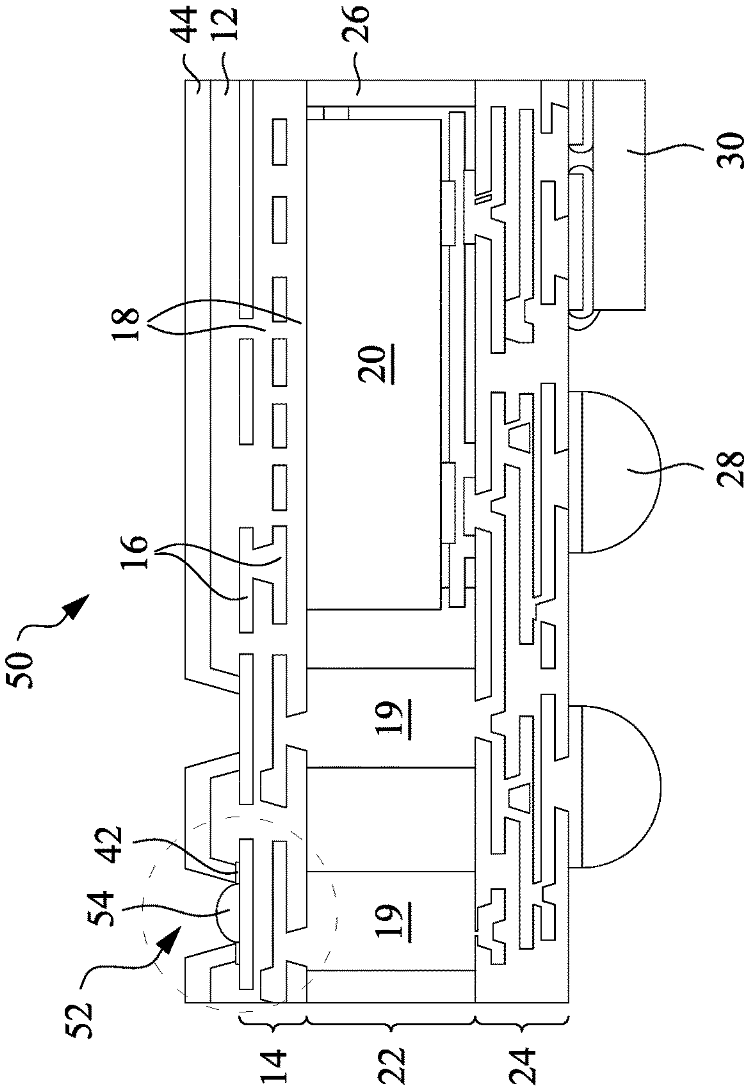
Fig. 7
Fig. 8
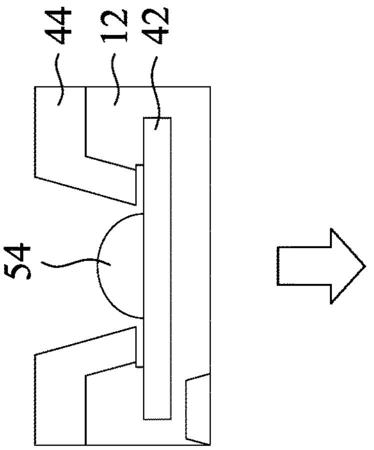
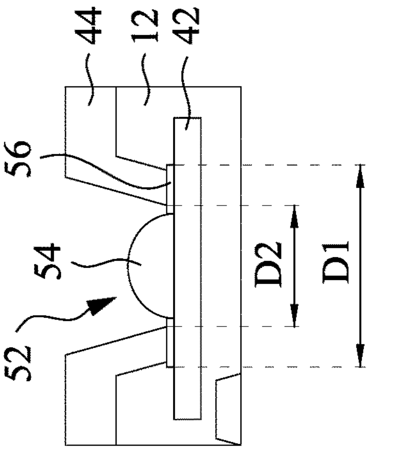
Fig. 9

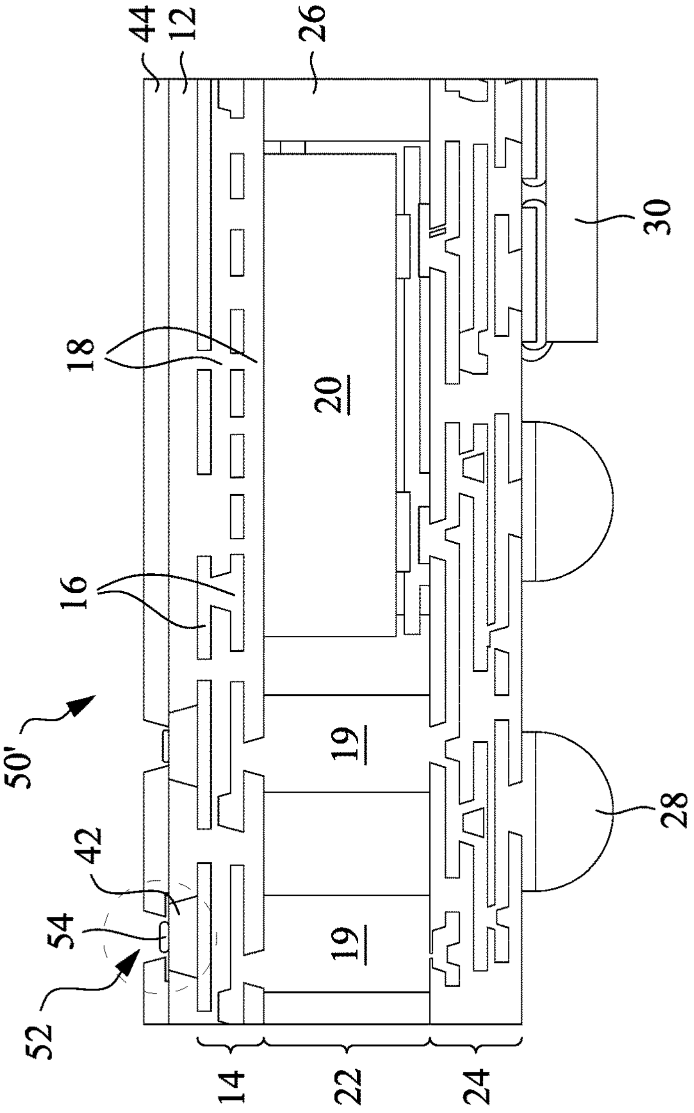
Fig. 17
Fig. 18
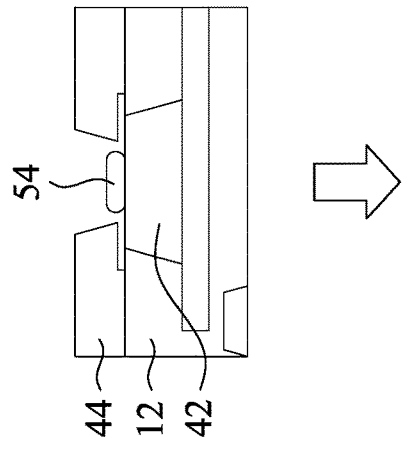
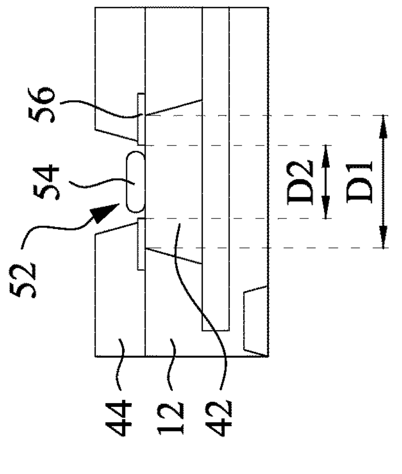
Fig. 19

INTEGRATED FAN-OUT PACKAGE AND METHOD OF MAKING SAME

BACKGROUND

The following relates to the electronic device packaging arts, integrated fanout (InFO) package manufacturing arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 diagrammatically illustrates a side sectional view of a portion of a final InFO-b package manufactured according to the first manufacturing process.

FIG. 8 diagrammatically illustrates one electrical contact of the interface redistribution layer (RDL) of the InFO-b package of FIG. 7, at a point in the manufacturing after disposing solderable material on the electrical contact but before applying an organic solderability preservative film.

FIG. 9 diagrammatically illustrates one electrical contact of the interface RDL of the InFO-b package of FIG. 7, at a point in the manufacturing after disposing solderable material on the electrical contact and after applying an organic solderability preservative film.

FIG. 17 diagrammatically illustrates a side sectional view of a portion of a final InFO-b package manufactured according to the second manufacturing process.

FIG. 18 diagrammatically illustrates one electrical contact of the interface RDL of the InFO-b package of FIG. 17, at a point in the manufacturing after disposing solderable material on the electrical contact but before applying an organic solderability preservative film.

FIG. 19 diagrammatically illustrates one electrical contact of the interface RDL of the InFO-b package of FIG. 17, at a point in the manufacturing after disposing solderable material on the electrical contact and after applying an organic solderability preservative film.

DETAILED DESCRIPTION

Figure 1:
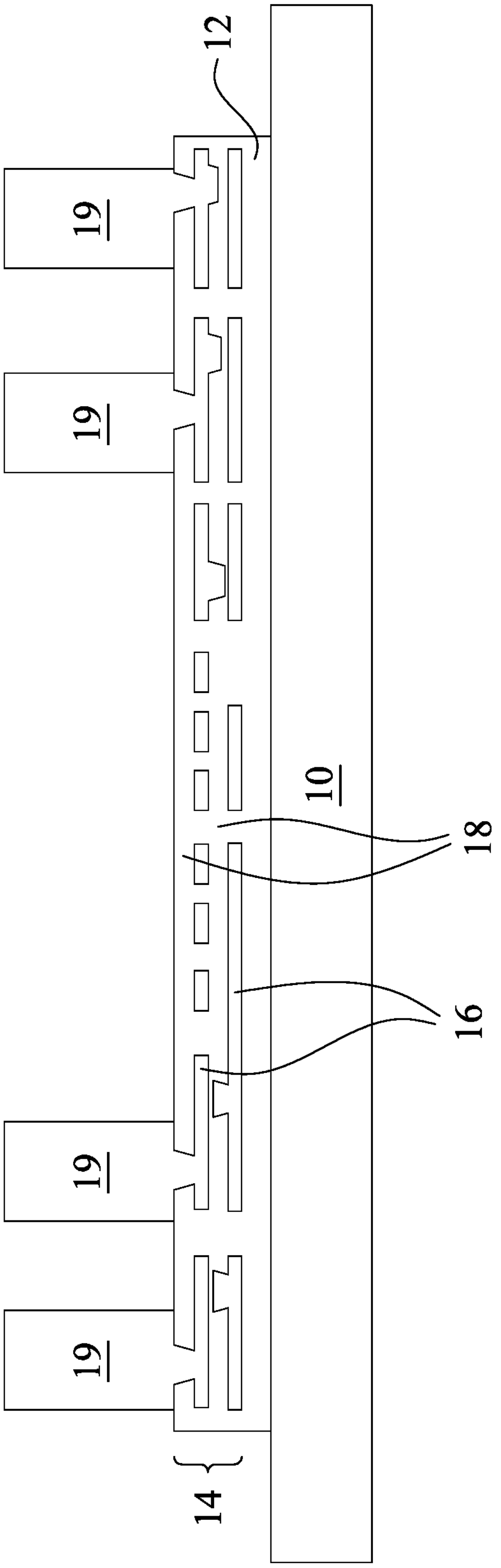
FIG. 1 diagrammatically illustrates a side sectional view of an initial stage of manufacturing of an integrated fanout (InFO) package of the bottom-only type (i.e., an InFO-b package) according to a first illustrative manufacturing process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package-on-package (PoP) assembly of integrated circuit (IC) wafers or chips has numerous advantages in providing a compact and low profile electronic assembly with high interconnects density and improved electrical and thermal performance. In an integrated fanout (InFO)-based PoP assembly, one or more "upper" IC packages are disposed on top of a "lower" InFO-based IC package. The InFO-based IC package typically includes a wafer or chip that is embedded in a dielectric molding that includes front-side and backside electrical redistribution layers (RDL's) providing fanout of contacts of the embedded wafer or chip, and a dielectric interlayer with through-InFO vias (TIV's) electrically interconnecting the front and back RDL's. One of the RDLs (referred to herein as the interface RDL) also provides the mounting surface and electrical interface with the top IC package(s). As an example, the InFO-based IC package may include a logic IC wafer or chip, and the upper IC package that is bonded to it may be a dynamic random access memory (DRAM) package, thereby forming a computing system with tightly integrated logic and memory that is suitable for use in a cellular telephone (cellphone) or other mobile device, for example.

In one approach, the InFO-based PoP package assembly is manufactured by a single manufacturing entity, which is typically the IC foundry. However, a variant of the InFO-based IC package, known as the bottom-only InFO package (i.e., InFO-b package) enables the final assembly of the top IC package(s) onto the InFO-b package to be performed by a third party, such as a customer, fabrication partner, or the like. To enable this approach, the interface RDL is modified to provide a stable surface with solderable pads. This InFO-b package is then suitably shipped to the third party, where the top IC package(s) can be soldered onto the InFO-b package via the solderable pads of the interface RDL. This arrangement has numerous advantages, such as enabling collaborative manufacturing between an IC foundry and its customer, enabling the customer to solder an in-house-manufactured top IC package onto the InFO-b package to form the complete PoP assembly, enabling a supply of the InFO-b packages to be kept in stock at the third party for later final assembly with the top IC package(s), providing flexibility for the third party to combine the InFO-b package with a choice of different possible top IC package(s) for further manufacturing flexibility, and/or so forth.

To ensure reliability and stability of the InFO-b package, the solderable pads should be robust against ingress of contaminants from the ambient environment. For example, infiltration of foreign ions from contaminants can lead to failure modes of the InFO-b package such as copper dendrites formed by $Na^+/K^+$ ion contamination penetrating into the copper or copper-based contacts of the interface RDL via gaps at the periphery of the solderable pads. For example, such a failure mode has been observed to manifest during Biased Highly Accelerated Temperature and Humidity (bHAST) testing.

Embodiments disclosed herein provide InFO-b packages and corresponding manufacturing methods with improved robustness of the interface RDL, and which reduce or eliminate such failure modes.

With reference to FIGS. 1-9, a first nonlimiting illustrative manufacturing process for manufacturing an InFO package of the bottom-only type (i.e., an InFO-b package) is diagrammatically shown. (The term "first" manufacturing process is simply enumerative and has no substantive significance). FIG. 1 diagrammatically illustrates a side sectional view of an initial stage of the first manufacturing process. The process starts with a carrier wafer 10, such as a glass, sapphire, or other wafer. At the stage shown in FIG. 1, a dielectric layer 12 has been deposited on the carrier wafer 10, followed by formation of an interface redistribution layer (RDL) 14 on the dielectric layer 12. The dielectric layer 12 may, for example, comprise a polymer material. The interface RDL 14 typically includes a plurality of patterned metal (or other electrically conductive) layers 16 separated by interposed layers of a polymer or other dielectric material 18. In some embodiments, the dielectric layer 12 may be made of the same polymer or other dielectric material as the dielectric material 18 of the interface RDL 14, and may alternatively be considered to be a first dielectric layer of the interface RDL 14. One nonlimiting illustrative processing sequence for forming the interface RDL 14 includes an iterative loop in which each repetition of the loop includes the following steps: (i) deposit a continuous polymer 18 (or other dielectric) layer; (ii) form openings in polymer layer 18 by photolithography; (iii) Ti/Cu seed layer deposition; (iv) photo resist coating and lithography; and (v) form an electrically conductive layer 18 of the RDL 14 by copper (Cu) plating and photoresist stripping and seed layer removal. In some embodiments, the step (i) of the first iteration of this loop forms the dielectric layer 12. Although not shown, it is contemplated to further include a release layer, such as an adhesive coating, interposed between the dielectric layer 12 and the carrier wafer 10, to assist in later debonding of the carrier wafer 10. To reach the stage depicted in FIG. 1, through-InFO vias (TIV's) 19 are also formed on the interface RDL 14. The TIV's 19 may be formed, for example, by depositing a sacrificial material on the interface RDL 14, photolithographically etching openings corresponding to the locations of the TIV's 19 in the sacrificial material, filling those openings with the copper or other electrically conductive material forming the TIV's 19, and then etching away or otherwise removing the sacrificial material.

Figure 2:
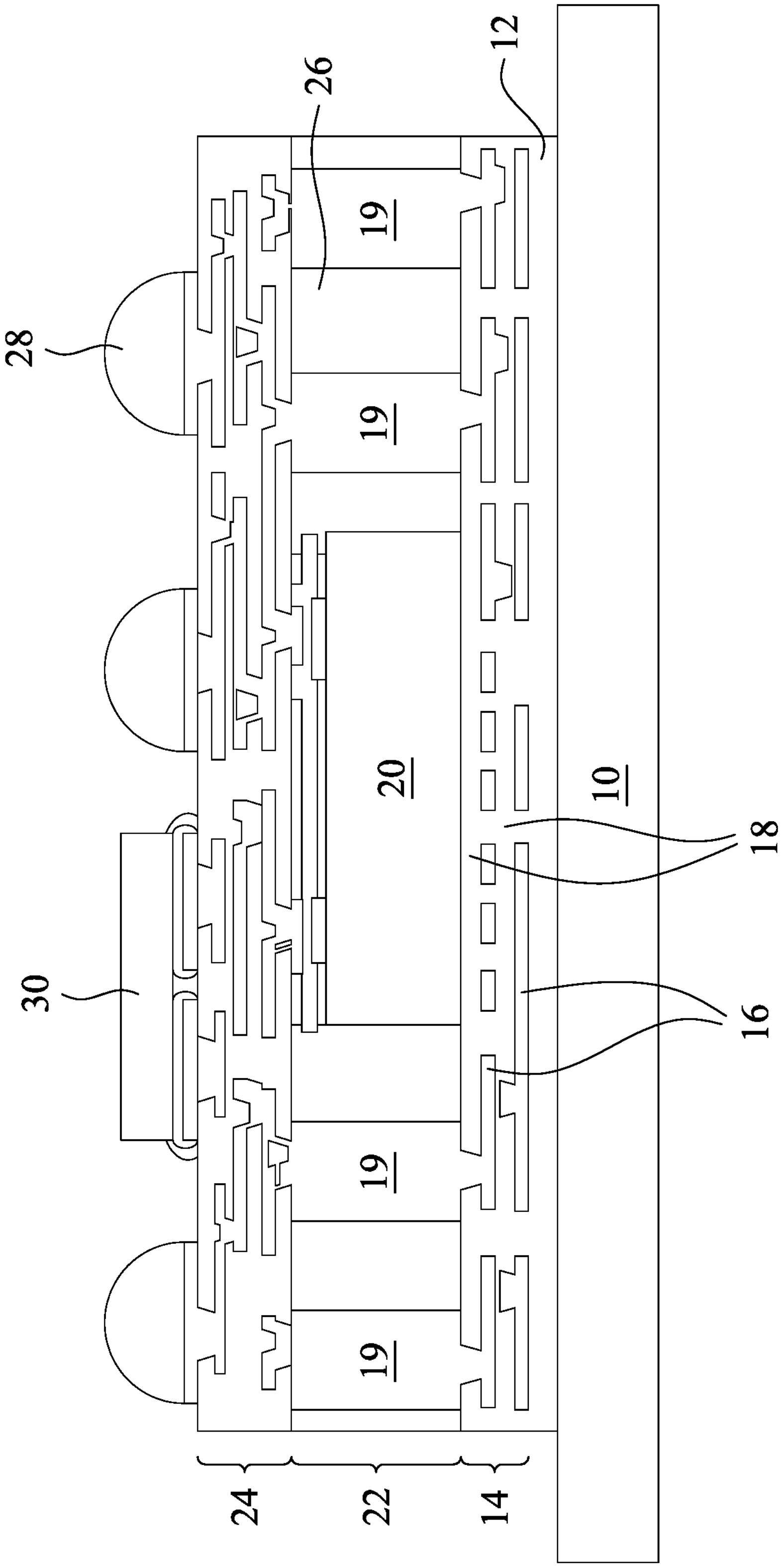
FIG. 2 diagrammatically illustrates a side sectional view of a further stage of the manufacturing of the InFO-b package according to the first manufacturing process.

FIG. 2 diagrammatically illustrates a side sectional view of a further stage of the manufacturing of the InFO-b package according to the first manufacturing process. To reach this stage, an integrated circuit (IC) wafer or chip 20 is embedded in a dielectric structure that includes an interface redistribution layer (RDL) covered by a dielectric layer, along with a dielectric interlayer 22 formed around the IC wafer or chip 20 and a second RDL 24. The dielectric interlayer 22 suitably comprises a molding material 26 that is molded around the IC wafer or chip 20 and around the TIV's 19. The molding material 26 should be a dielectric, and may for example comprise a resin or other polymer and silica or another filler, as a nonlimiting illustrative example. In one suitable manufacturing approach, the IC wafer or chip 20 is placed on the interface RDL 14 using a pick-and-place (PnP) or other die attachment. The PnP placement is followed by molding of the molding material 26, grinding to planarize the surface, and deposition of the second RDL 24 on the planarized surface. The formation of the second RDL 24 can employ the same iterative loop processing previously described for forming the interface RDL 14, and may include the same electrically conductive and dielectric materials. In the embodiment of FIG. 2 the IC wafer or chip 20 is electrically connected with the second RDL 24; however, the IC wafer or chip 20 could additionally or alternatively be electrically connected with the interface RDL 14. To reach the stage shown in FIG. 2, the processing further includes disposing a ball grid array (BGA) 28 on electrical contacts of the second RDL 24. The BGA 28 allows the final InFO-b package to be surface-mounted so as to be fastened on and electrically connected with a printed circuit board (PCB) or the like (features not shown). The illustrative example of FIG. 2 further shows an integrated passive device (IPD) 30, such as a decoupling capacitor, mounted to the second RDL 24. Such an IPD or other integrated electronic components (e.g., an integrated inductor, resistor, or so forth) is optional.

It is noted that while the illustrative embodiment forms the TIV's 19 first (FIG. 1) and then the molding material 26 is molded around the TIV's 19, in a variant embodiment the molding material could be molded around the IC wafer or chip 20, followed by lithographically defining openings corresponding to the TIV's and filling said openings with an electrically conductive material to form the TIV's.

The through-InFO vias (TIV's) 19 provide electrical contact between the interface RDL 14 and the second RDL 24. The second RDL 24 provides fanout for the contacts of the IC wafer or chip 20. In similar fashion, the interface RDL 24 provides fanout for facilitating the subsequent coupling to a "top" IC package to be mounted onto the InFO-b package. However, in another contemplated variant, the second RDL 24 optionally may be omitted. For example, the second RDL 24 may be omitted if the electrical contacts of the IC wafer or chip 20 are suitable for directly forming the BGA 28 on the IC wafer or chip.

Figure 3:
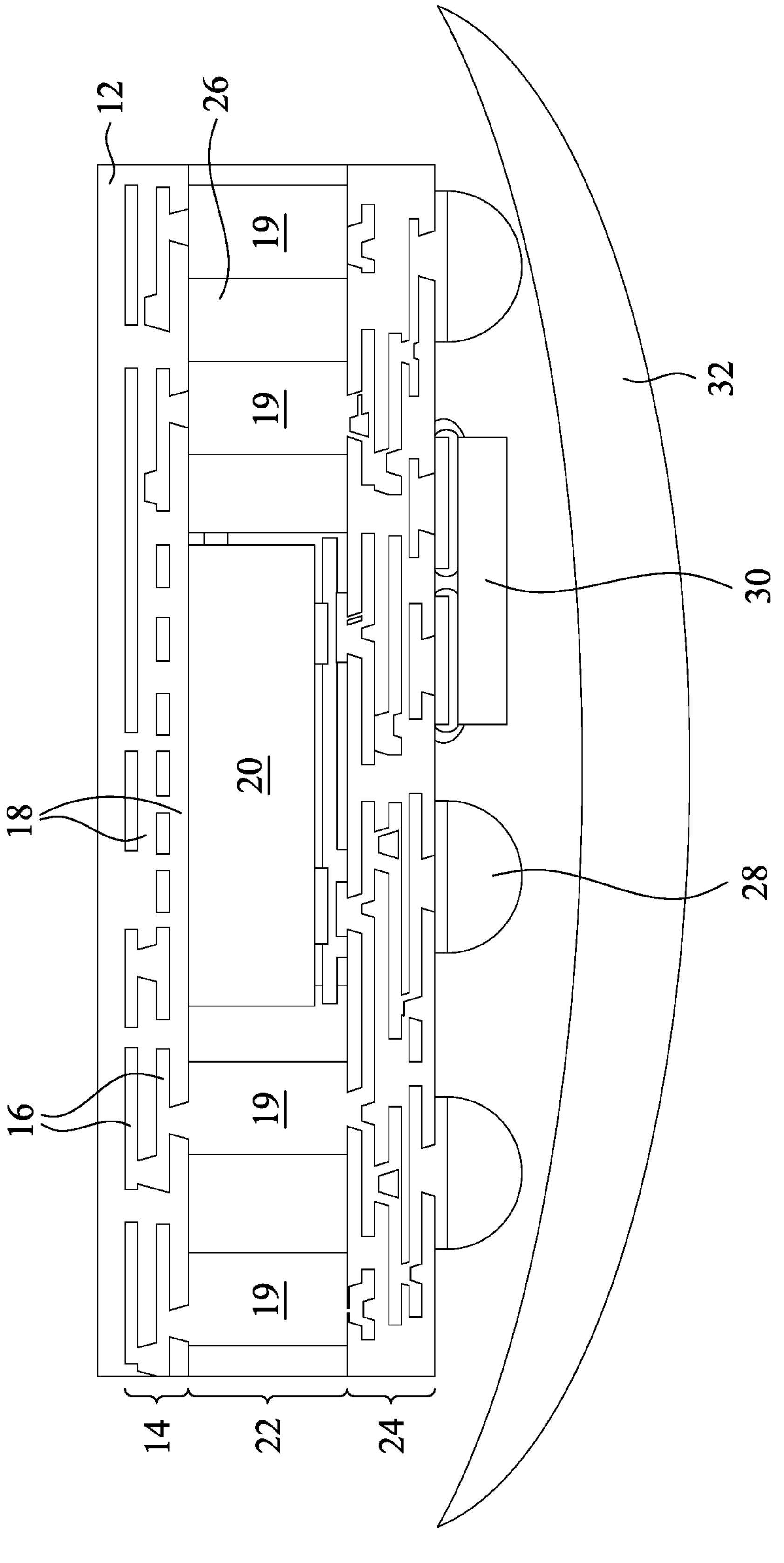
FIG. 3 diagrammatically illustrates a side sectional view of a further stage of the manufacturing of the InFO-b package according to the first manufacturing process.

FIG. 3 diagrammatically illustrates a side sectional view of a further stage of the manufacturing of the InFO-b package according to the first manufacturing process. To reach this stage, the carrier wafer 10 shown in FIGS. 1 and 2 is removed to expose the dielectric layer 12. In a suitable approach, the BGA 28 is secured to an adhesive (and typically flexible) frame tape 32, and an adhesive coating interposed between the surface of the carrier wafer 10 and the dielectric layer 12 is dissolved using a laser process or the like to debond the carrier wafer 10 from the dielectric layer 12.

Figure 4:
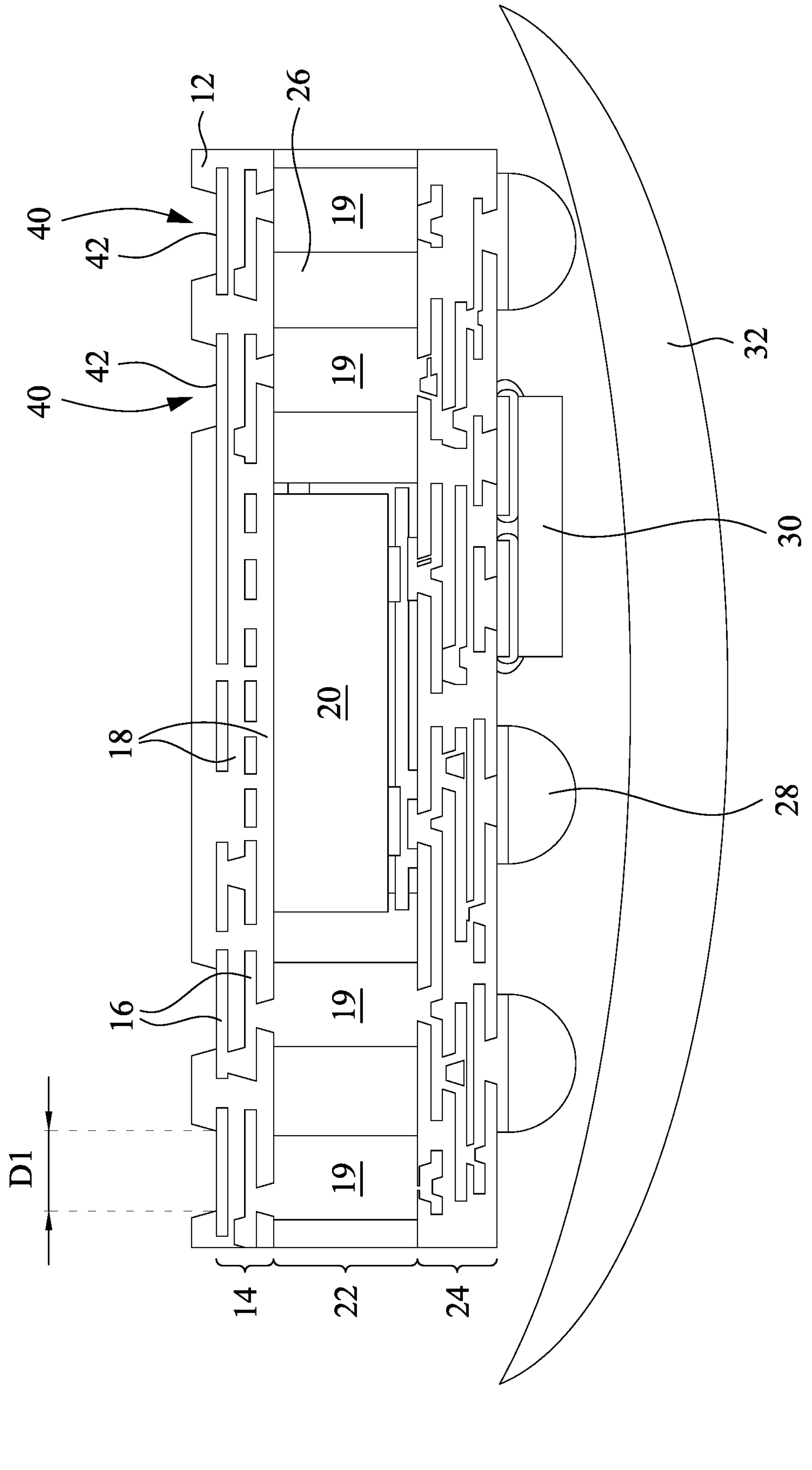
FIG. 4 diagrammatically illustrates a side sectional view of a further stage of the manufacturing of the InFO-b package according to the first manufacturing process.

FIG. 4 diagrammatically illustrates a side sectional view of a further stage of the manufacturing of the InFO-b package according to the first manufacturing process. To reach this stage, access openings 40 are formed in dielectric layer 12, which pass through the dielectric layer 12 to expose electrical contacts 42 of the interface RDL 14. Each access opening 40 is thus aligned with an underlying interface RDL electrical contact 42. In some embodiments, the access openings 40 are smaller than the respective underlying electrical contacts 42 that are aligned with the respective access openings. In some embodiments, each access opening 40 has a diameter D1 that is less than a diameter of the electrical contact 42 of the interface RDL that is aligned with the access opening.

In some embodiments, the access openings 40 are formed by laser drilling the access openings 40 passing through the dielectric layer 12. The laser drilling may, for example, be performed using an excimer laser, a Nd:YAG laser, a $CO_2$ laser, or so forth, by way of some nonlimiting illustrative examples. The wavelength and intensity of the laser light used in the laser drilling is chosen so to drill the polymer (or other dielectric material) of the dielectric layer 12, and to not drill (or at least less aggressively drill) the metal or other electrically conductive material of the electrical contacts 42. Hence, the electrical contacts 42 serve as natural stops for the laser drilling that forms the access openings 40, and the laser drilling thus exposes the surface of the electrical contacts 42.

Figure 5:
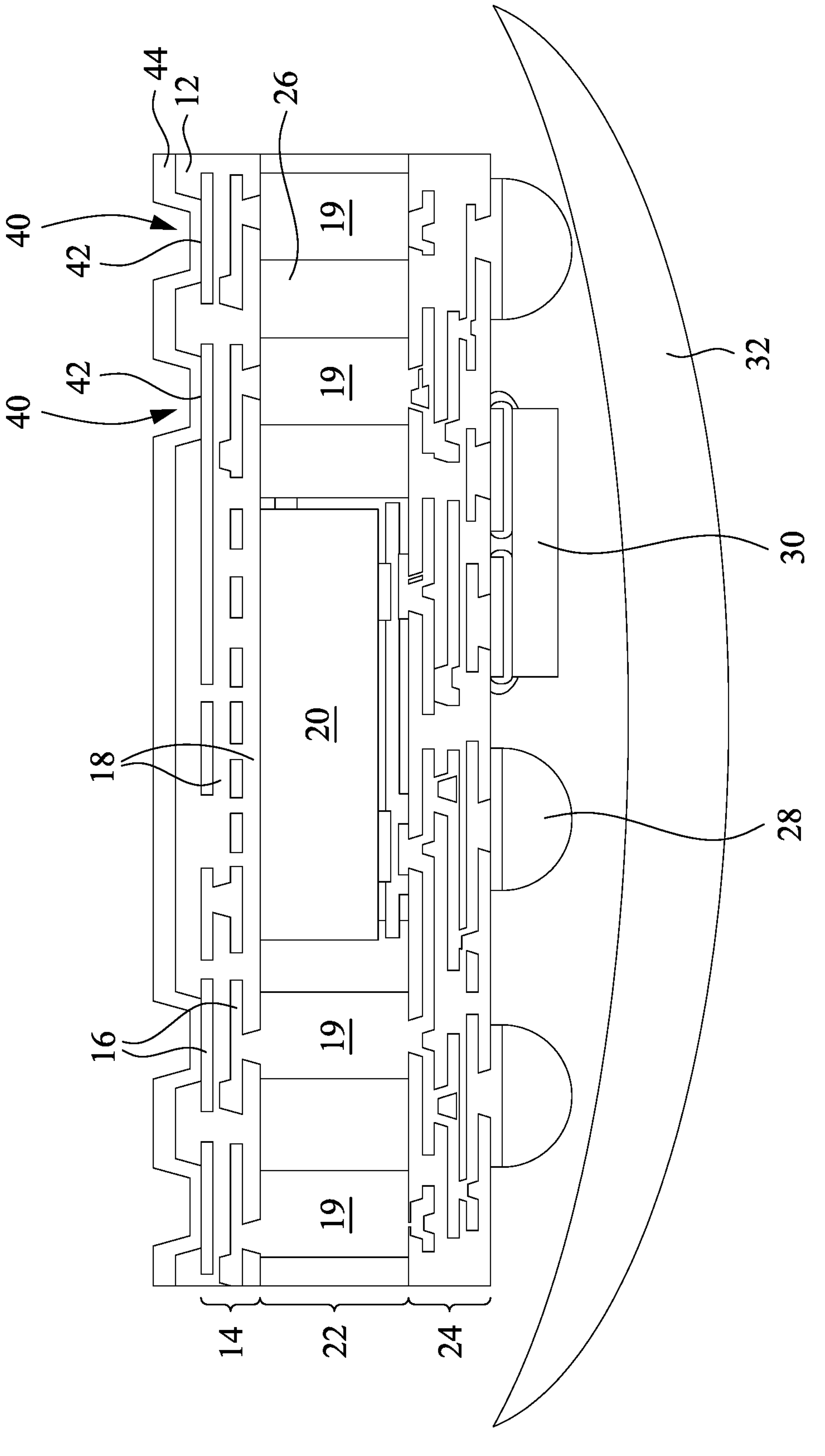
FIG. 5 diagrammatically illustrates a side sectional view of a further stage of the manufacturing of the InFO-b package according to the first manufacturing process.

FIG. 5 diagrammatically illustrates a side sectional view of a further stage of the manufacturing of the InFO-b package according to the first manufacturing process. To reach this stage, after forming the access openings 40, a second dielectric layer 44 is disposed over both the dielectric layer 12 and the electrical contacts 42 of the interface RDL 14 that are exposed by the access openings 40. In some embodiments, the second dielectric layer 44 is embodied as an adhesive tape 44 that is taped onto (i.e. adhered to) the second dielectric layer. The adhesive tape 44 is sufficiently flexible to be conformably disposed inside the access openings 40 during the taping process. In some nonlimiting illustrative embodiments, the adhesive tape 44 comprises a polymer and filler. While use of an adhesive tape as the second dielectric layer 44 is described here, it is alternatively contemplated for the second dielectric layer 44 to be formed by vacuum deposition or the like of a suitable dielectric material. The adhesive tape 44 provides enhanced protection for the surface of the InFO-b package that will ultimately be the surface on which the DRAM or other top IC package is mounted. However, as seen in FIG. 5 the adhesive tape 44 covers the access openings 40 that (prior to the taping) provided access to the electrical contacts 42 of the interface RDL 14.

Figure 6:
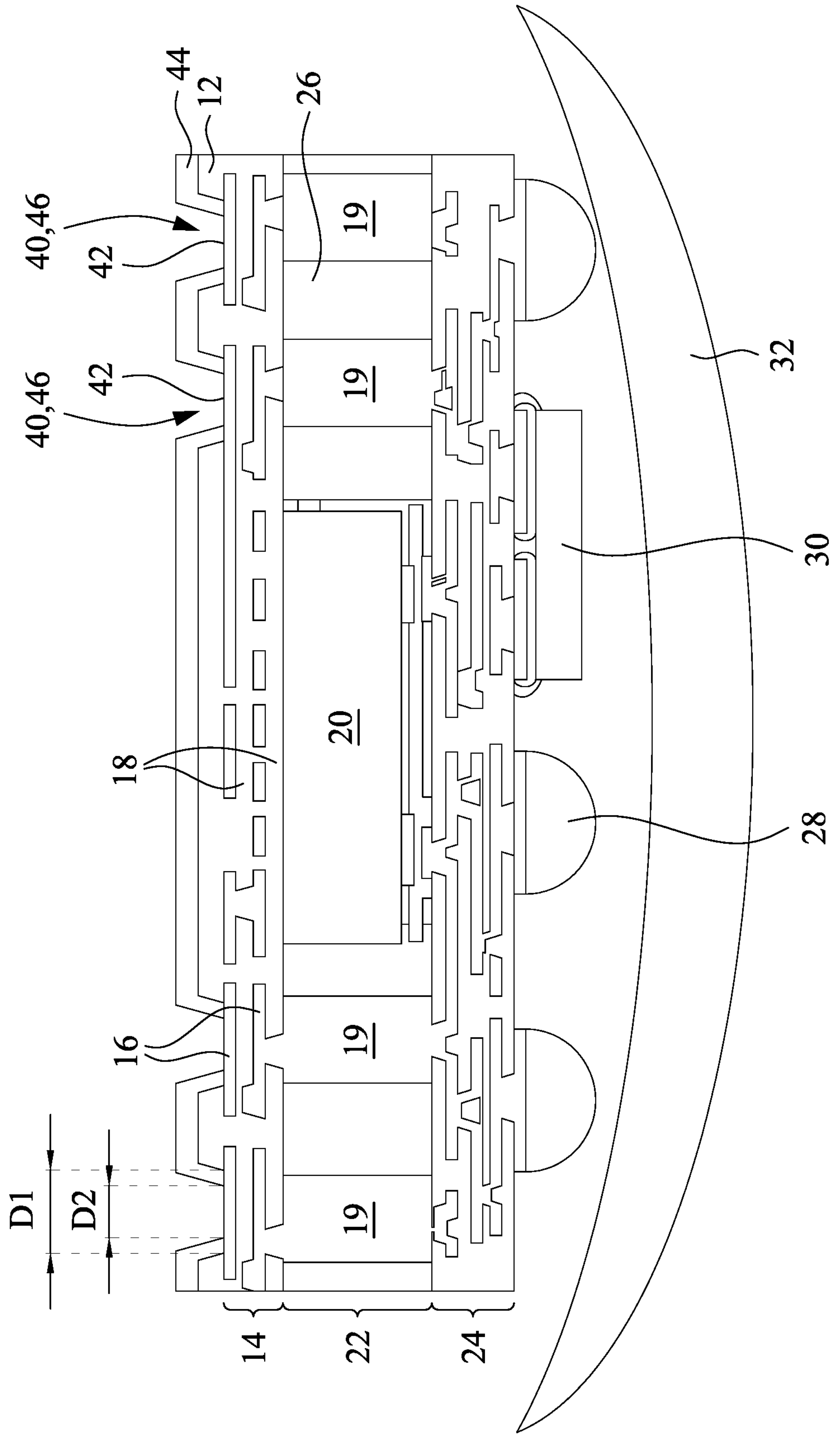
FIG. 6 diagrammatically illustrates a side sectional view of a further stage of the manufacturing of the InFO-b package according to the first manufacturing process.

FIG. 6 diagrammatically illustrates a side sectional view of a further stage of the manufacturing of the InFO-b package according to the first manufacturing process. To reach this stage, aligned openings 46 are formed which pass through the adhesive tape or other second dielectric layer 44. The aligned openings 46 are aligned with the access openings 40 passing through the dielectric layer 12. Hence, the combination of the access openings 40 passing through the dielectric layer 12 and the aligned openings 46 passing through the second dielectric layer 44 provide access to (i.e. expose) the underlying electrical contacts 42 of the interface RDL 14. As indicated in FIG. 6, a diameter D2 of the aligned openings 46 passing through the adhesive tape 44 is smaller than a diameter D1 of the access openings 40 passing through the dielectric layer 12.

In some embodiments, the aligned openings 46 passing through the adhesive tape 44 are formed by laser drilling. The laser drilling may, for example, be performed using an excimer laser, a Nd:YAG laser, a $CO_2$ laser, or so forth, by way of some nonlimiting illustrative examples. The wavelength and intensity of the laser light used in the laser drilling is chosen so to drill the polymer/filler (or other dielectric material) of the adhesive tape or other second dielectric layer 44, and to not drill (or at least less aggressively drill) the metal or other electrically conductive material of the electrical contacts 42. Hence, the electrical contacts 42 serve as natural stops for the laser drilling that forms the aligned openings 46, and the laser drilling thus exposes the surface of the electrical contacts 42.

In some embodiments, the same laser (e.g., the same excimer laser, same Nd:YAG laser, same $CO_2$ laser, or so forth) is used in both the drilling step that forms the access openings 40 in the dielectric layer 12 (see FIG. 4) and in the subsequent drilling step that forms the aligned openings 46 passing through the adhesive tape or other second dielectric layer 44. If this is the case, then the laser beam is suitably more tightly focused during the second drilling step that forms the aligned openings 46 compared with during the first drilling step that forms the access openings 40, so as to achieve the smaller diameter D2 for the aligned openings 46 compared with the larger diameter D1 of the access openings 40.

FIG. 7 diagrammatically illustrates a side sectional view of a portion of a final InFO-b package 50 manufactured according to the first manufacturing process. To complete the first manufacturing process, the stage shown in FIG. 6 is further processed by forming solderable pads 52 on the electrical contacts 42 of the interface RDL 14.

With continuing reference to FIG. 7 and with further reference to FIGS. 8 and 9, in one approach this processing includes disposing solderable material 54 on the electrical contacts 42 exposed by the access openings 40 and aligned openings 46 in the respective dielectric layer 12 and second dielectric layer 44. The solderable material 54 may, by way of nonlimiting illustrative example, comprise a tin/silver (Sn/Ag) solder or other type of solder with flux material. FIG. 8 diagrammatically illustrates one electrical contact 42 of the interface RDL 14, at a point in the manufacturing immediately after disposing the solderable material 54 on the electrical contact 42. Optionally, the processing further includes, after disposing the solderable material 54 on the electrical contacts 42, applying an organic solderability preservative (OSP) film 56 by immersion. The OSP film 56 self-aligns with portions of the electrical contacts 42 of the interface RDL 14 on which the solderable material 54 is not disposed. FIG. 9 diagrammatically illustrates completed solderable pad 52 on one electrical contact 42 of the interface RDL 14 of the InFO-b package 50 of FIG. 7, which includes the self-aligned OSP film 56. In embodiments in which the electrical contacts 42 are copper or a copper alloy, the OSP film 56 may, by way of nonlimiting illustrative example, comprise a compound of rosin, resin, azole, and/or so forth that selectively deposits on copper over silver or other solderable material 54.

It will be noted that the processing steps extending from the formation of the access openings 40 in the dielectric layer 12 (see FIG. 4) to the final InFO-b package 50 shown in FIG. 7 can be performed at relatively low temperature. The laser drilling steps can be done at room temperature (with some localized heating produced by the laser drilling), the second dielectric layer 44 can be applied at room temperature as an adhesive tape, and the formation of the solderable pads 52 can also be done at relatively low temperature. These processes also typically do not involve chemicals likely to introduce ionic contaminants. Hence, this processing is unlikely to lead to infiltration of foreign ions of the type that can lead to failure modes such as copper dendrite formation due to $Na^+/K^+$ ion contamination penetrating into the copper or copper-based electrical contacts 42 of the interface RDL 14.

Moreover, as explained below, the manufacture of the InFO-b device 50 just described substantially reduces likelihood of such failure modes during any subsequent high temperature processing, such as during Biased Highly Accelerated Temperature and Humidity (bHAST) testing.

If a single laser drilling step were to be performed to simultaneously drill through both the dielectric layer 12 and the adhesive tape 44, this would result in the interface between the dielectric layer 12 and the underlying electrical contact 42 of the interface RDL 42 being directly exposed to the ambient environment. This exposed interface between the dielectric layer 12 and the underlying electrical contact 42 can provide an entry point for ingress of foreign ions such as $Na^+$ and $K^+$ ions penetrating into the copper or copper-based electrical contacts and leading to formation of copper dendrites and failure during bHAST testing.

By contrast, the first manufacturing process described with reference to FIGS. 1-9 employs a two-step laser drilling process. In this process, in a first laser drilling step the access openings 40 of diameter D1 are formed in the dielectric layer 12 (see FIG. 4). This is followed by disposing the adhesive tape (or other second dielectric layer) 44 over the dielectric layer 12 and the electrical contacts 42 of the interface RDL 14 (see FIG. 5), and then performing a second laser drilling step in which the aligned openings 46 are formed in the adhesive tape 44 (see FIG. 6). These aligned openings 46 have smaller diameter D2, that is, D2<D1. As best seen in FIGS. 8 and 9, this results in the adhesive tape 44 protecting the interface between the dielectric layer 12 and the underlying electrical contact 42 of the interface RDL 14. The subsequent immersion process forming the self-aligned OSP film 56 then fills any remaining gap, as seen in FIG. 9.

Figure 10:
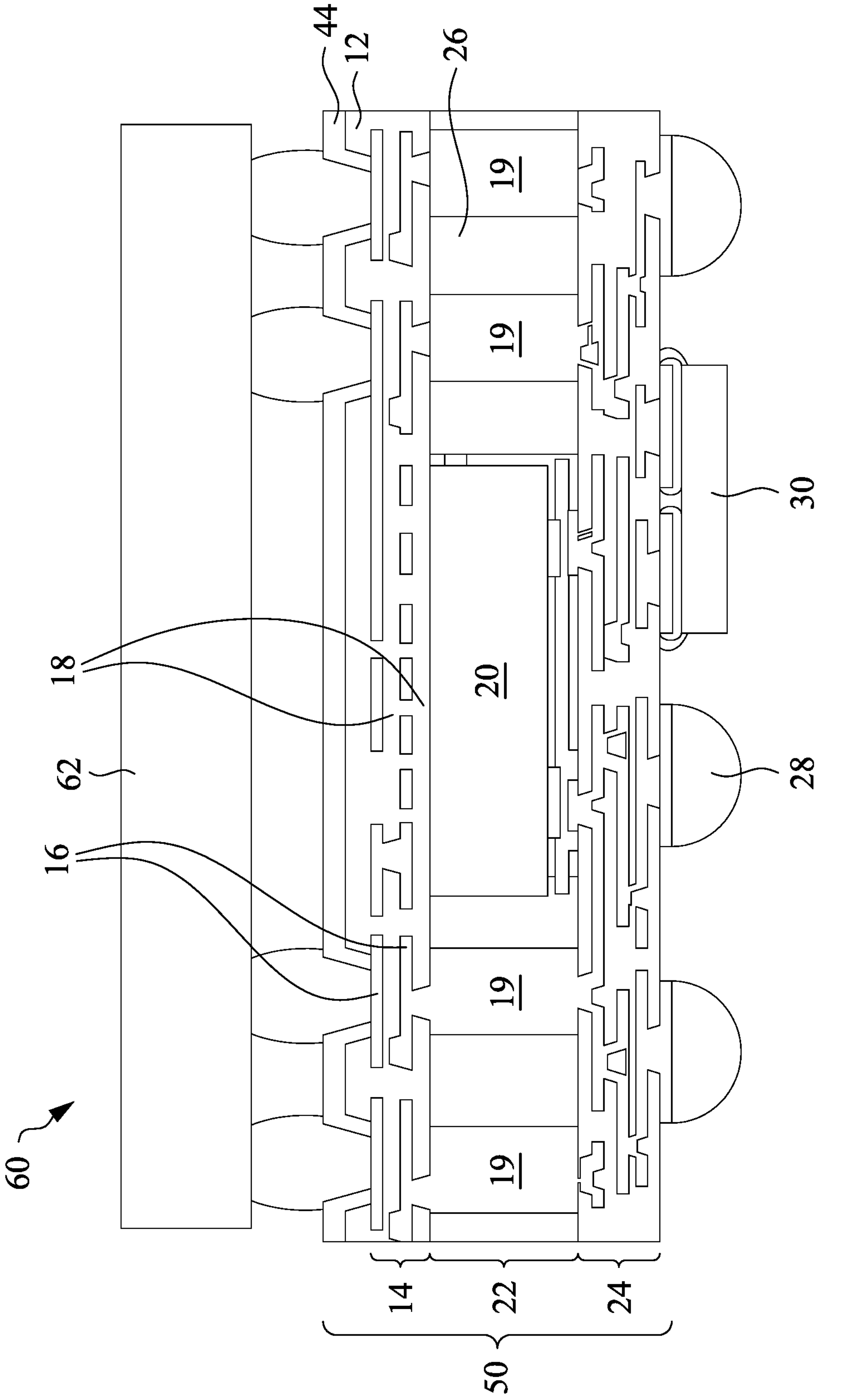
FIG. 10 diagrammatically illustrates a side sectional view of a package-on-package (PoP) assembly constructed by soldering an IC package onto the final InFO-b package shown in FIG. 7.

With reference back to FIG. 7 and with further reference to FIG. 10, the InFO-b package 50 of FIG. 7 is suitable for shipping to a third party for use in completing a package-on-package (PoP) assembly. FIG. 10 diagrammatically illustrates a side sectional view of such as resulting PoP assembly 60, which is constructed by soldering an IC package 62 onto the final InFO-b package 50 shown in FIG. 7. As seen in FIG. 10, solder bumps 64 provide the soldered connection between the IC package 62 and the solderable pads 52 on the electrical contacts 42 of the interface RDL 14 of the InFO-b package 50. Advantageously, the robustness of the solderable pads 52 provided by the adhesive tape 44 protecting the interface between the dielectric layer 12 and the underlying electrical contact 42 of the interface RDL 14 is expected to increase the yield of the PoP assembly 60 thus formed. By way of one nonlimiting illustrative embodiment, the IC wafer or chip 20 embedded in the InFO-b package 50 may be a logic IC of a computer central processing unit (CPU), graphical processing unit (GPU), or the like, and the IC package 62 that is soldered onto the InFO-b package 50 may be a dynamic random access memory (DRAM) package, so that the completed PoP assembly 60 provides a computing system or device that is complete with its own on-board DRAM 62. It is noted that while FIG. 10 illustrates a single IC package 62 being soldered onto the final InFO-b package 50, in other embodiments two or more such IC packages can be soldered onto the final InFO-b package 50.

With reference to FIGS. 11-19, a second nonlimiting illustrative manufacturing process for manufacturing an InFO package of the bottom-only type (i.e., an InFO-b package) is diagrammatically shown. (The term "second" manufacturing process is simply enumerative and has no substantive significance). In the side sectional vies of FIGS. 11-19, components analogous to those of the embodiment of FIGS. 1-10 are labeled with like reference numbers, e.g. the InFO-b package fabricated in the process of FIGS. 11-19 likewise includes the embedded IC wafer or chip 20, the interface RDL 14, the dielectric layer 12, the adhesive tape or other second dielectric layer 44, and so forth. However, as will be described, the formation of some of these features in the second manufacturing process described with reference to FIGS. 11-19 differs in order of processing steps and/or processing details when compared with the first illustrative manufacturing process of FIGS. 1-9.

Figure 11:
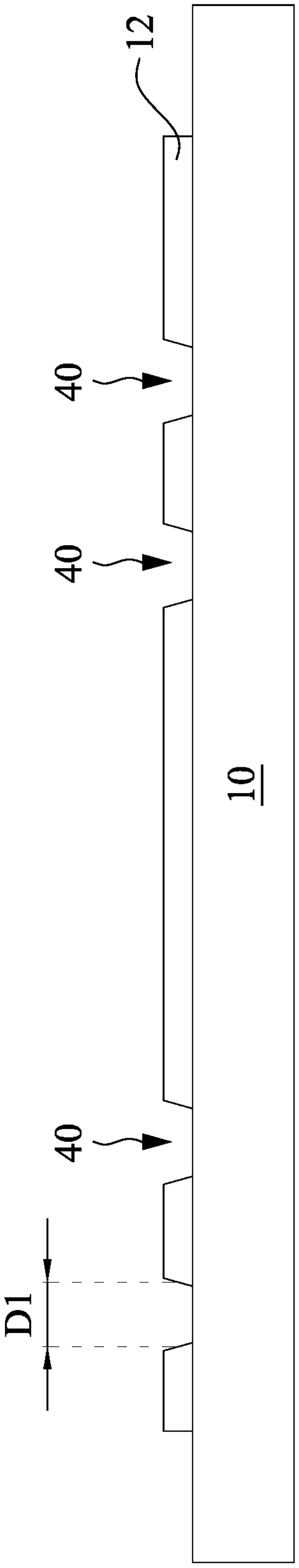
FIG. 11 diagrammatically illustrates a side sectional view of an initial stage of manufacturing of an InFO-b package according to a second illustrative manufacturing process.

FIG. 11 diagrammatically illustrates a side sectional view of an initial stage of manufacturing of an InFO-b package according to the second manufacturing process.

Figure 12:
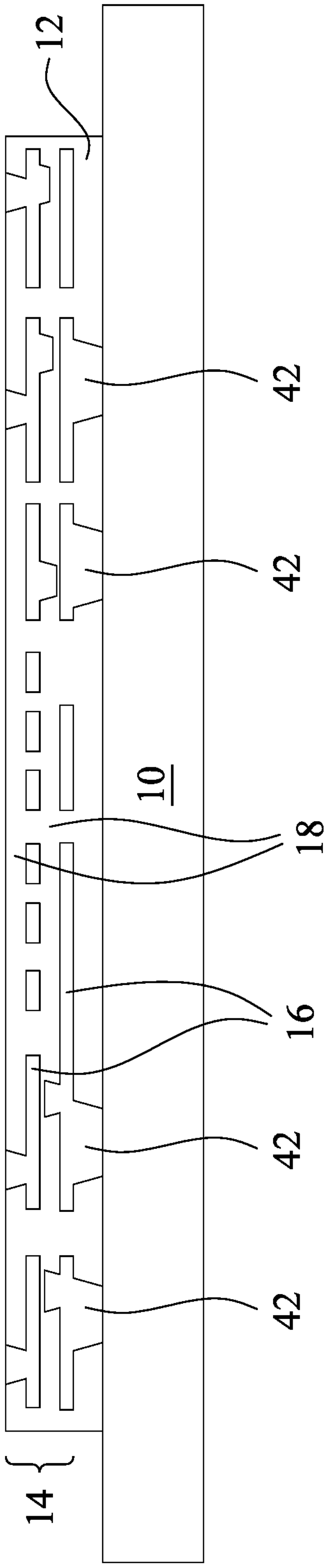
FIG. 12 diagrammatically illustrates a side sectional view of a further stage of the manufacturing of the InFO-b package according to the second manufacturing process.

FIG. 12 diagrammatically illustrates a side sectional view of a further stage of the manufacturing of the InFO-b package according to the second manufacturing process. As with the first manufacturing process, the dielectric layer 12 is formed on the carrier wafer 10. However, in the second manufacturing process the access openings 40 passing through the dielectric layer 12 are created prior to the formation of the interface RDL 14, as seen in FIG. 11. In one nonlimiting illustrative embodiment, the access openings 40 passing through the dielectric layer 12 are created using photolithographically controlled etching of the dielectric layer 12. That is, a photoresist is coated onto the dielectric layer 12 and is exposed to light via a photomask defining the access openings to create a latent image of the photomask in the photoresist, and then the exposed photoresist is developed to form openings in the photoresist corresponding to the access openings 40 after which the developed photoresist is used to limit etching of the dielectric layer 12 to remove material only in the areas of the access openings thereby creating the access openings 40. The photolithographically etched access openings 40 suitably have the diameter D1 as described for the first manufacturing process (compare with FIG. 4).

FIG. 12 diagrammatically illustrates a side sectional view of a further stage of the manufacturing of the InFO-b package according to the second manufacturing process. As there seen, to reach the stage of FIG. 12 the interface RDL 14 is formed. As further seen in FIG. 12, the formation of the interface RDL 14 on the dielectric layer 12 in this second manufacturing process includes filling the access openings 40 passing through the dielectric layer 12 with electrically conductive material to form the electrical contacts 42 of the interface RDL 14. The formation of the interface RDL 14 can employ the same iterative process previously described for the first manufacturing embodiment, and the interface RDL 14 again suitably includes the patterned metal (or other electrically conductive) layers 16 separated by interposed layers of a polymer or other dielectric material 18.

Figure 13:
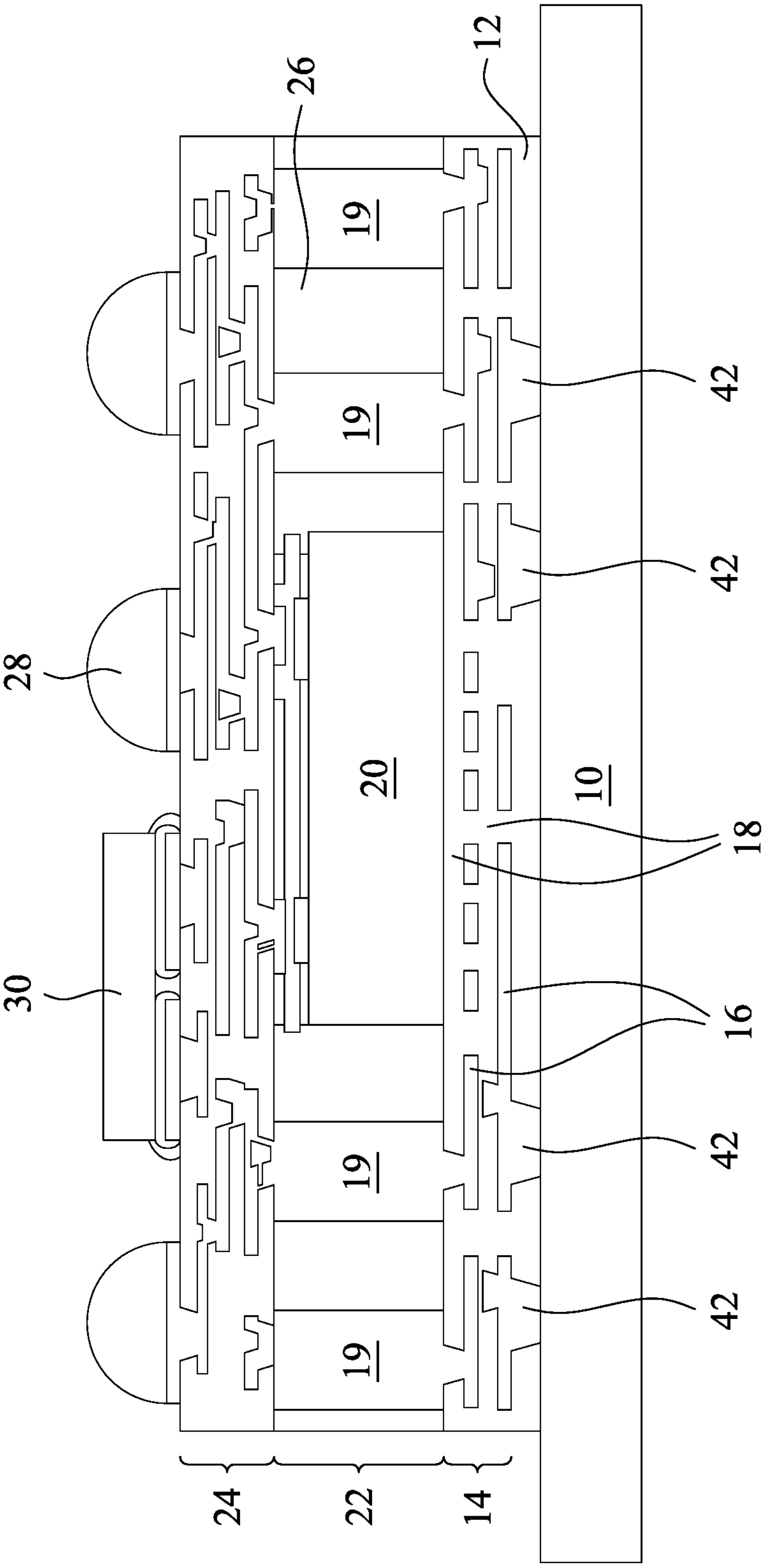
FIG. 13 diagrammatically illustrates a side sectional view of a further stage of the manufacturing of the InFO-b package according to the second manufacturing process.

FIG. 13 diagrammatically illustrates a side sectional view of a further stage of the manufacturing of the InFO-b package according to the second manufacturing process. To reach the stage shown in FIG. 13, processing analogous to that previously described with reference to FIG. 2 for the first manufacturing embodiment is suitably performed. Thus, this processing includes disposing the IC wafer or chip 20 on the interface RDL 14, forming the dielectric interlayer 22 around the IC wafer or chip, the dielectric interlayer including the plurality of through-InFO vias (TIV's) 19; and forming the second RDL 24 on the IC wafer or chip 20 and the dielectric interlayer 22. Again, the TIV's 19 provide electrical contact between the interface RDL 14 and the second RDL 24. As also previously discussed, it is contemplated to omit formation of the second RDL 24. The embodiment of FIG. 13 also depicts formation of the ball grid array (BGA) 28 on electrical contacts of the second RDL 24, as well as providing the optional integrated passive device (IPD) 30, such as a decoupling capacitor, mounted to the second RDL 24.

Figure 14:
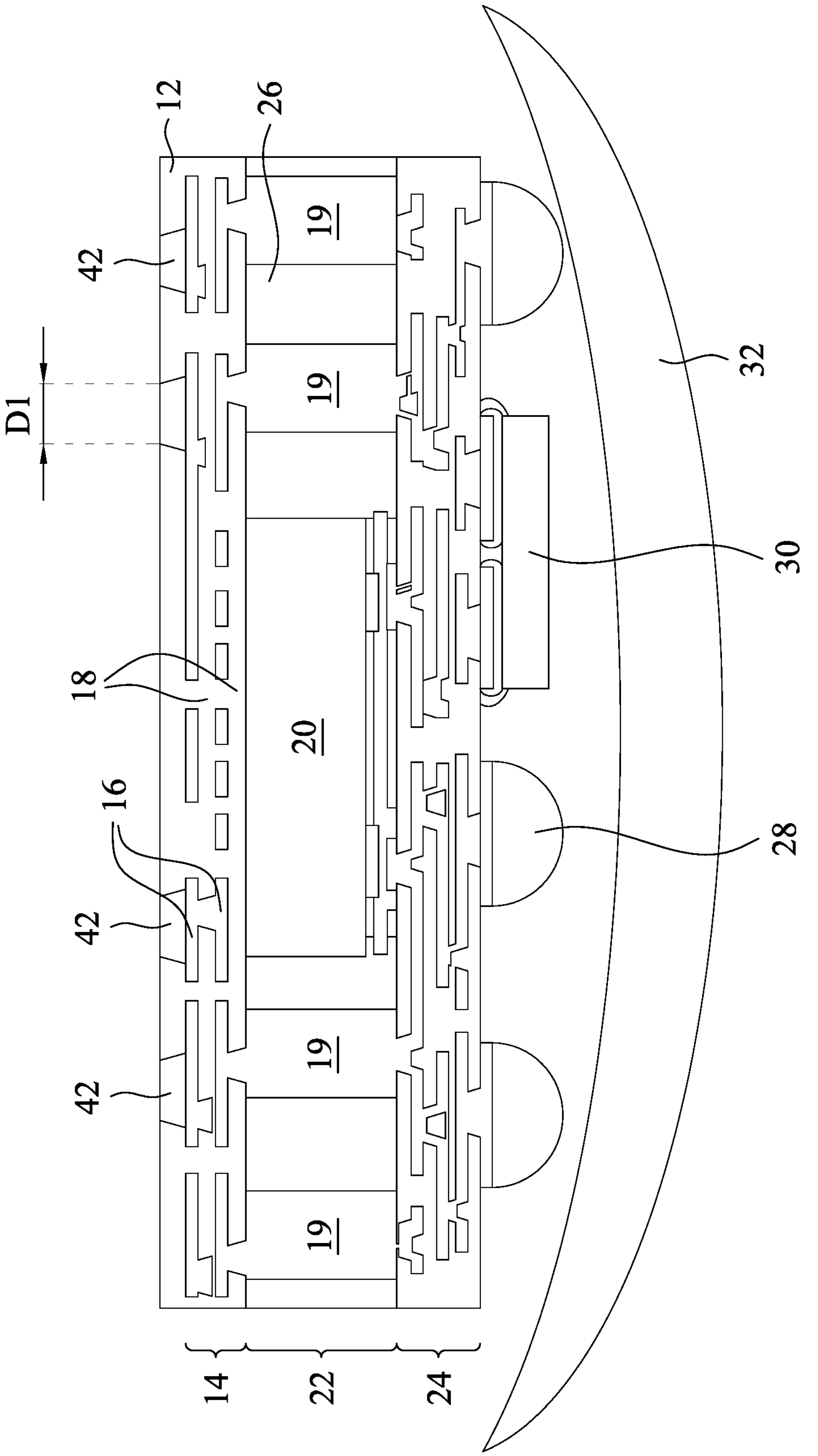
FIG. 14 diagrammatically illustrates a side sectional view of a further stage of the manufacturing of the InFO-b package according to the second manufacturing process.

FIG. 14 diagrammatically illustrates a side sectional view of a further stage of the manufacturing of the InFO-b package according to the second manufacturing process. To reach the stage of FIG. 14, the second manufacturing process includes adhering the BGA 28 to the adhesive (and typically flexible) frame tape 32, and removing the carrier wafer 10 to expose the dielectric layer 12 and the electrical contacts 42 of the interface RDL 14. As previously described for the first manufacturing embodiment, the removal of the carrier wafer 10 can in some embodiments be done by dissolving an adhesive coating (not shown) that is interposed between the surface of the carrier wafer 10 and the dielectric layer 12 using a laser process or the like.

The configuration of the under-fabrication InFO-b package at the stage of the second manufacturing process shown in FIG. 14 is similar to the under-fabrication InFO-b package of the first manufacturing process shown in FIG. 3. However, a difference is that in the under-fabrication InFO-b package of the second manufacturing process shown in FIG. 14, the electrical contacts 42 of the interface RDL 14 are already exposed, and the top surfaces of the electrical contacts 42 are generally coplanar with (i.e. flush with) the exposed surface of the dielectric layer 12. This is due to the processing steps already described with reference to FIGS. 11 and 12. A consequence of this is that the exposed top surfaces of the electrical contacts have the diameter D1 of the access openings 40 formed in the initial processing shown in FIG. 11 (and also as indicated in FIG. 14).

Figure 15:
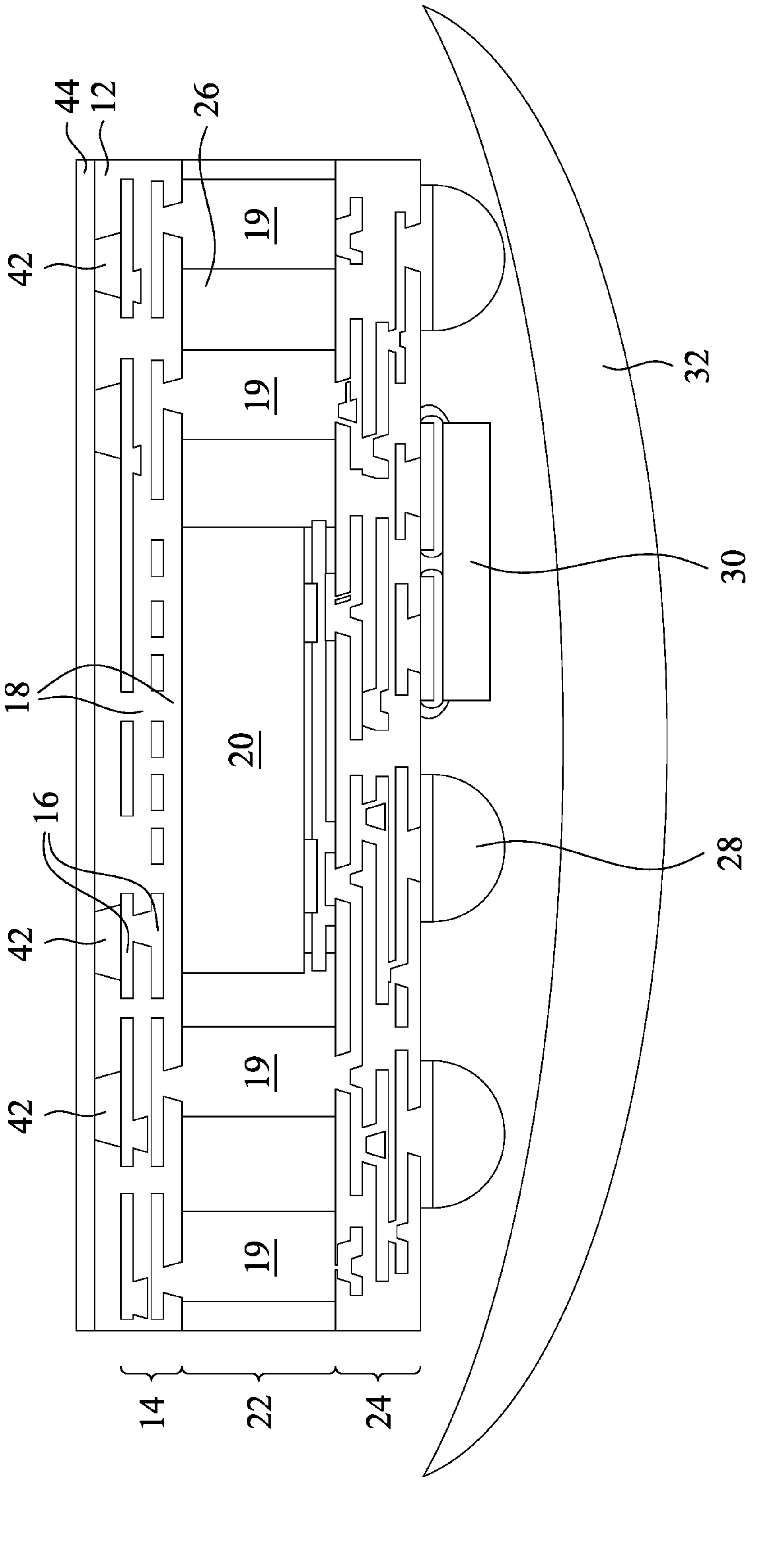
FIG. 15 diagrammatically illustrates a side sectional view of a further stage of the manufacturing of the InFO-b package according to the second manufacturing process.

FIG. 15 diagrammatically illustrates a side sectional view of a further stage of the manufacturing of the InFO-b package according to the second manufacturing process. To reach this stage, the adhesive tape (or other second dielectric layer) 44 is disposed over both the dielectric layer 12 and the electrical contacts 42 of the interface RDL 14. This step is analogous to that described with reference to FIG. 5 for the first manufacturing embodiment. A difference is that since the top surfaces of the electrical contacts 42 are generally coplanar with (i.e. flush with) the exposed surface of the dielectric layer 12, the adhered tape 44 is essentially planar.

Figure 16:
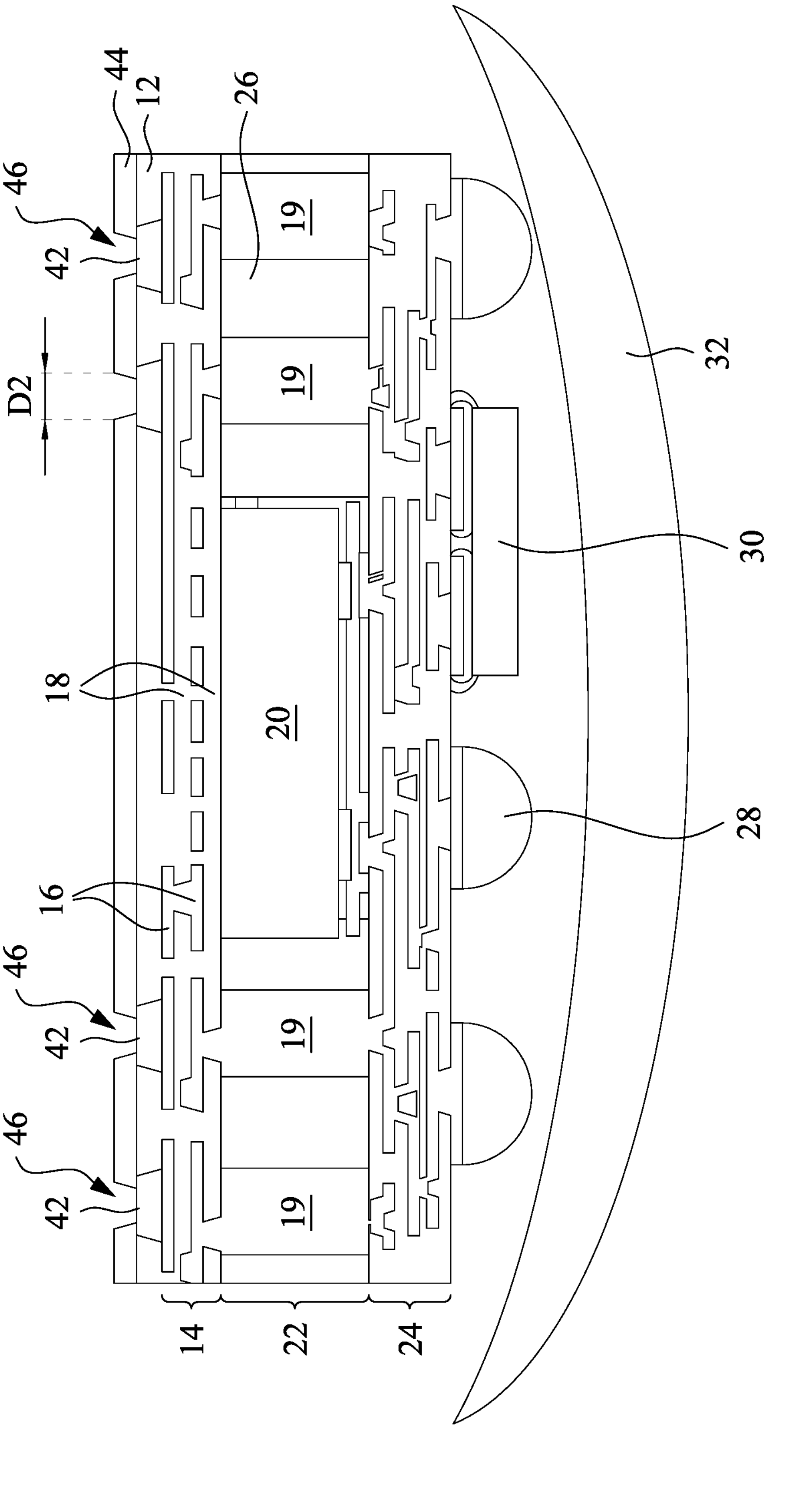
FIG. 16 diagrammatically illustrates a side sectional view of a further stage of the manufacturing of the InFO-b package according to the second manufacturing process.

FIG. 16 diagrammatically illustrates a side sectional view of a further stage of the manufacturing of the InFO-b package according to the second manufacturing process. To reach the stage shown in FIG. 16, aligned openings 46 are formed in the adhesive tape 44, for example by laser drilling. This operation is analogous to the (second) laser drilling step of the first manufacturing process which was previously described with reference to FIG. 6. In the second manufacturing process and as shown in FIG. 16, the aligned openings 46 are formed with the diameter D2, which is smaller than the diameter D1 of the exposed surfaces of the aligned electrical contacts 42.

FIG. 17 diagrammatically illustrates a side sectional view of a portion of a final InFO-b package 50' manufactured according to the second manufacturing process. To complete the second manufacturing process, the stage shown in FIG. 16 is further processed by forming the solderable pads 52 on the electrical contacts 42 of the interface RDL 14.

With continuing reference to FIG. 17 and with further reference to FIGS. 18 and 19, in one approach this processing includes disposing solderable material 54 on the electrical contacts 42 exposed by the aligned openings 46 in the adhesive tape (or other second dielectric layer) 44. The solderable material 54 may, by way of nonlimiting illustrative example, comprise a tin/silver (Sn/Ag) solder or other type of solder with flux material. FIG. 18 diagrammatically illustrates one electrical contact 42 of the interface RDL 14, at a point in the second manufacturing process immediately after disposing the solderable material 54 on the electrical contact 42. Optionally, the processing further includes, after disposing the solderable material 54 on the electrical contacts 42, applying an OSP film 56 by immersion. The OSP film 56 self-aligns with portions of the electrical contacts 42 of the interface RDL 14 on which the solderable material 54 is not disposed. FIG. 19 diagrammatically illustrates completed solderable pad 52 on one electrical contact 42 of the interface RDL 14 of the InFO-b package 50' of FIG. 17, which includes the self-aligned OSP film 56. In embodiments in which the electrical contacts 42 are copper or a copper alloy, the OSP film 56 may, by way of nonlimiting illustrative example, comprise a compound of rosin, resin, azole, and/or so forth that selectively deposits on copper over silver or other solderable material 54.

As seen in FIG. 19, the diameter D2 of the aligned openings 46 in the adhesive tape 44 is smaller than the diameter D1 of the exposed surface of the aligned electrical contact 42. As with the first manufacturing process, the second manufacturing process thus results in the adhesive tape 44 protecting the interface between the dielectric layer 12 and the electrical contact 42 of the interface RDL 14. The subsequent immersion process forming the self-aligned OSP film 56 then fills any remaining gap, as seen in FIG. 19. Hence, the second manufacturing embodiment is also expected to ensure that the solderable pads 52 are robust against ingress of contaminants from the ambient environment, such as infiltration of foreign ions from contaminants that can otherwise lead to failure modes of the InFO-b package, such as copper dendrites formed by $Na^+/K^+$ ion contamination penetrating into the copper or copper-based contacts of the interface RDL via gaps at the periphery of the solderable pads.

In either the first manufacturing embodiment or the second manufacturing embodiment, D1>D2 to ensure the adhesive tape 44 protects the interface between the dielectric layer 12 and the electrical contact 42 of the interface RDL 14. In some nonlimiting illustrative embodiments, D1≥10 microns. In some nonlimiting illustrative embodiments, D1>D2≥10 microns. In some nonlimiting embodiments the ratio $D_1/D_2 \geq 1.05$.

In the following, some further embodiments are described.

In a nonlimiting illustrative embodiment, a method of manufacturing an integrated fan-out (InFO) package is disclosed. The method includes: embedding an integrated circuit (IC) wafer or chip in a dielectric structure that includes an interface redistribution layer (RDL) covered by a dielectric layer; forming access openings passing through the dielectric layer to expose electrical contacts of the interface RDL; after forming the access openings, disposing a second dielectric layer over both the dielectric layer and the electrical contacts of the interface RDL; forming aligned openings passing through the second dielectric layer which are aligned with the access openings passing through the dielectric layer; and forming solderable pads on the electrical contacts of the interface RDL.

In a nonlimiting illustrative embodiment, a method of manufacturing an InFO package is disclosed. The method includes: disposing a dielectric layer on a carrier wafer; creating access openings passing through the dielectric layer using photolithographically controlled etching; forming an interface RDL on the dielectric layer including filling the access openings passing through the dielectric layer with electrically conductive material to form electrical contacts of the interface RDL; disposing an IC wafer or chip on the interface RDL; forming a dielectric interlayer around the IC wafer or chip, the dielectric interlayer including a plurality of through-interlayer vias; forming a second RDL on the IC wafer or chip and the dielectric interlayer, wherein the through-interlayer vias provide electrical contact between the interface RDL and the second RDL; removing the carrier wafer to expose the dielectric layer and the electrical contacts of the interface RDL; after the removing, disposing a second dielectric layer over both the interface RDL and the electrical contacts of the interface RDL; forming aligned openings passing through the second dielectric layer which are aligned with the electrical contacts of the interface RDL; and forming solderable pads on the electrical contacts of the interface RDL.

In a nonlimiting illustrative embodiment, an InFO package includes: an IC wafer or chip; a dielectric structure within which the IC wafer or chip is embedded, the dielectric structure including an interface RDL with RDL electrical contacts and a dielectric layer covering the interface RDL and including access openings passing through the dielectric layer which are aligned with respective interface RDL electrical contacts; and a second dielectric layer covering the dielectric layer and including aligned openings passing through the second dielectric layer which are aligned with respective access openings of the dielectric layer and with respective RDL electrical contacts. Each aligned opening is smaller than the aligned access opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated fan-out (InFO) package, the method comprising:
   - embedding an integrated circuit (IC) wafer or chip in a dielectric structure that includes an interface redistribution layer (RDL) covered by a dielectric layer;
   - forming access openings passing through the dielectric layer to expose electrical contacts of the interface RDL;
   - after forming the access openings, taping an adhesive tape onto the dielectric layer, the adhesive tape covering the access openings;
   - after the taping, forming aligned openings passing through the adhesive tape which are aligned with the access openings passing through the dielectric layer; and
   - forming solderable pads on the electrical contacts of the interface RDL.

2. The method of claim 1 wherein each aligned opening passing through the adhesive tape has a diameter that is less than a diameter of the aligned access opening passing through the dielectric layer.

3. The method of claim 1 wherein the embedding includes:
   - forming the dielectric layer on a carrier wafer;
   - forming the interface RDL on the dielectric layer;
   - disposing the IC wafer or chip on the interface RDL;
   - forming a dielectric interlayer around the IC wafer or chip, the dielectric interlayer including a plurality of through-interlayer vias;
   - forming a second RDL on the IC wafer or chip and the dielectric interlayer, wherein the through-interlayer vias provide electrical contact between the interface RDL and the second RDL; and
   - removing the carrier wafer to expose the dielectric layer.

4. The method of claim 3 further comprising, prior to the removing of the carrier wafer, disposing a ball grid array on electrical contacts of the second RDL.

5. The method of claim 1 wherein the forming of the access openings passing through the dielectric layer to expose the electrical contacts of the interface RDL includes:
   - laser drilling the access openings passing through the dielectric layer.

6. The method of claim 1 wherein the forming of the aligned openings passing through the adhesive tape includes:
   - laser drilling the aligned openings passing through the adhesive tape.

7. The method of claim 6, wherein:
   - each aligned opening passing through the adhesive tape has a diameter that is less than a diameter of the aligned access opening passing through the dielectric layer;
   - the forming of the access openings passing through the dielectric layer to expose the electrical contacts of the interface RDL includes laser drilling the access openings passing through the dielectric layer; and
   - wherein the laser drilling to form the access openings passing through the dielectric layer and the laser drilling of the aligned openings passing through the adhesive tape comprises a two-step laser drilling process in which the laser drilling to form the access openings is a first laser drilling step and the laser drilling of the aligned openings passing through the adhesive tape is a second laser drilling step.

8. The method of claim 1 wherein the electrical contacts of the interface RDL comprise copper.

9. A package-on-package (POP) assembly method comprising:

manufacturing an integrated fan-out (InFO) package by performing the method of claim 1; and soldering at least one IC package onto the InFO package via the solderable pads.

10. The method of claim 1, wherein the adhesive tape comprises polymer and filler.

11. The method of claim 1, wherein the forming of the solderable pads on the electrical contacts of the interface RDL includes:

disposing solderable material on the electrical contacts of the interface RDL; and after disposing the solderable material on the electrical contacts of the interface RDL, applying an organic solderability preservative film by immersion wherein the organic solderability preservative film self-aligns with portions of the electrical contacts of the interface RDL on which the solderable material is not disposed.

12. A method of manufacturing an integrated fan-out (InFO) package, the method comprising:

disposing a dielectric layer on a carrier wafer;

forming an interface redistribution layer (RDL) on the dielectric layer;

disposing an integrated circuit (IC) wafer or chip on the interface RDL;

forming a dielectric interlayer around the IC wafer or chip, the dielectric interlayer including a plurality of through-interlayer vias;

forming a second RDL on the IC wafer or chip and the dielectric interlayer, wherein the through-interlayer vias provide electrical contact between the interface RDL and the second RDL;

removing the carrier wafer to expose the dielectric layer;

disposing an adhesive tape over both the interface RDL and electrical contacts of the interface RDL, the disposing including taping the adhesive tape onto the dielectric layer;

forming aligned openings passing through the adhesive tape which are aligned with the electrical contacts of the interface RDL, wherein each aligned opening has a diameter that is less than a diameter of the electrical contact of the interface RDL that is aligned with the aligned opening; and forming solderable pads on the electrical contacts of the interface RDL.

13. The method of claim 12 further comprising:

creating access openings passing through the dielectric layer using photolithographically controlled etching;

wherein the forming of the RDL on the dielectric layer includes filling the access openings passing through the dielectric layer with electrically conductive material to form the electrical contacts of the interface RDL;

wherein the removal of the carrier wafer also exposes the electrical contacts of the interface RDL; and wherein the adhesive tape is disposed over both the interface RDL and the electrical contacts of the interface RDL after the removal of the carrier wafer.

14. The method of claim 13 wherein the forming of the aligned openings passing through the second dielectric layer includes:

laser drilling the aligned openings through the adhesive tape.

15. The method of claim 12 further comprising, prior to the removing of the carrier wafer, disposing a ball grid array on the second RDL.

16. The method of claim 12 wherein the electrical contacts of the interface RDL comprise copper.

17. A package-on-package (POP) assembly method comprising:

manufacturing an integrated fan-out (InFO) package by performing the method of claim 12; and soldering at least one IC package onto the InFO package via the solderable pads.

18. The method of claim 12, wherein the forming of the solderable pads on the electrical contacts of the interface RDL includes:

disposing solderable material on the electrical contacts of the interface RDL within the aligned openings; and after the disposing of the solderable material, applying an organic solderability preservative film upon the solderable material.

19. A method of manufacturing an integrated fan-out (InFO) package, the method comprising:

forming a dielectric structure with an integrated circuit (IC) wafer or chip embedded in the dielectric structure, the forming of the dielectric structure including forming an interface redistribution layer (RDL) with RDL electrical contacts and a dielectric layer covering the interface RDL and including access openings passing through the dielectric layer which are aligned with respective interface RDL electrical contacts;

disposing a second dielectric layer covering the dielectric layer; and forming aligned openings passing through the second dielectric layer which are aligned with respective access openings of the dielectric layer and with respective RDL electrical contacts, wherein each aligned opening is smaller than the aligned access opening;

disposing solderable material on the electrical contacts of the interface RDL within the aligned openings; and after disposing the solderable material on the electrical contacts, applying an organic solderability preservative film upon the solderable material by immersion wherein the organic solderability preservative film fills a gap between the electrical contacts and the second dielectric layer.

20. The method of claim 19 wherein the forming of the dielectric structure further includes:

forming a dielectric interlayer disposed around the IC wafer or chip, the dielectric interlayer including a plurality of through-interlayer vias; and forming a second RDL disposed on the IC wafer or chip and on the dielectric interlayer, wherein the through-interlayer vias provide electrical contact between the interface RDL and the second RDL.

* * * * *